(12) United States Patent
Zhan

(10) Patent No.: US 9,742,387 B2
(45) Date of Patent: Aug. 22, 2017

(54) VOLTAGE COMPARATOR

(71) Applicant: Shenzhen Goodix Technology Co., Ltd., Shenzhen (CN)

(72) Inventor: Chang Zhan, Shenzhen (CN)

(73) Assignee: Shenzhen Goodix Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/203,796

(22) Filed: Jul. 7, 2016

(65) Prior Publication Data

US 2016/0315604 A1 Oct. 27, 2016

Related U.S. Application Data

(63) Continuation of application No. PCT/CN2014/088469, filed on Oct. 13, 2014.

(30) Foreign Application Priority Data

Apr. 28, 2014 (CN) .......................... 2014 1 0174425

(51) Int. Cl.
*H03K 5/24* (2006.01)
*G01R 19/00* (2006.01)
*H03K 5/22* (2006.01)

(52) U.S. Cl.
CPC ....... *H03K 5/2481* (2013.01); *G01R 19/0038* (2013.01); *H03K 5/22* (2013.01)

(58) Field of Classification Search
CPC .......... H03K 5/22; H03K 5/24; H03K 5/2472; H03K 5/2481; G01R 19/0038
See application file for complete search history.

(56) References Cited

U.S. PATENT DOCUMENTS

| 4,818,897 A * | 4/1989 | Krenik | H03K 19/01714 327/170 |
| 2013/0099825 A1* | 4/2013 | Cheng | H03K 5/2472 327/65 |

FOREIGN PATENT DOCUMENTS

| CN | 200910242582.3 | 6/2010 |
| CN | 201010601379.3 | 7/2012 |
| CN | 201210242224.4 | 7/2012 |

* cited by examiner

*Primary Examiner* — Patrick O'Neill

(57) ABSTRACT

The present disclosure is applicable to electronic fields, and provides a voltage comparator. The voltage comparator includes a first branch, a second branch and a third branch. The first branch and the second branch both have self-biasing capabilities, and require no dedicated bias circuit. Under the same power voltage, the static power consumption of the voltage comparator is relatively low; fewer the power consuming branches exist in the circuit, and the reliability is high under low power consumption.

15 Claims, 7 Drawing Sheets

VOLTAGE COMPARATOR

CROSS-REFERENCE TO RELATED APPLICATIONS

The present application is a continuation of international application No. PCT/CN2014/088469, filed on Oct. 13, 2014, which claims priority to Chinese Patent Application No. 201410174425.4, filed on Apr. 28, 2014, both of which are hereby incorporated by reference in its entireties.

TECHNICAL FIELD

The present disclosure relates to electronic fields, and more particularly, relates to a voltage comparator having low static power consumption.

BACKGROUND

Low power consumption technologies are more and more concerned in portable electronic devices. For example, with respect to smart phones and tablet computers, static power consumption has become a critical indicator of the products. Because these products use batteries as power supplies, reduction of the power consumption signifies an increase of standby duration and life time, which eventually brings good use experience to users.

FIG. 1 illustrates a common voltage comparator circuit, and power consumption of the circuit is determined by a tail current source IB. The circuit has two deficiencies: firstly, in an equilibrium state where a tested voltage VIN is equal to a voltage of a first input terminal VR, IB is uniformly distributed in a branch where transistors M1 and M2 are located, that is, a current of 0.5*IB is sufficient to support operation of the branch where the transistor M2 is located. However, if VIN causes M1 to be cut off, generally the IB would totally flow through M2. Obviously, an excessive current of 0.5*IB is wasted. Secondly, the tail current source IB is generally formed by NMOS transistors, and an additional bias circuit is required for providing a gate voltage. Therefore, the actual power consumption of the circuit is even greater.

A related fully-differential high-speed low power consumption comparator has the advantages of high output slew rate and high speed. However, the power consumption of such comparator reaches 56 µW, and this power consumption is calculated without taking into account the bias circuit needed for the comparator. Therefore, the actual power consumption of the circuit is even greater. For example, a related time domain comparator with a low power consumption feedback control structure uses digital logic control for reducing static power consumption. However, the power consumption of such comparator is 9 µW, and this power consumption is calculated without taking into account a digital time sequence circuit needed for the comparator. Similarly, the actual power consumption of the circuit is even greater. Still for example, a related voltage comparator uses sub-threshold working properties of transistor for reducing the power consumption of the circuit while ensuring a specific circuit delay, and the power consumption is 2 µW. In addition, although the circuit may have self-biasing capability, the comparator has four power-consuming branches. Therefore, if it is desired to reduce the operating current to be less than 100 nA, the power consumption of each branch needs to be averagely reduced to 25 nA, and this lowers a reliability of the circuit.

SUMMARY

The present disclosure provides a voltage comparator, including a first branch, a second branch and a third branch; wherein: the first branch includes a first transistor, a second transistor and a third transistor; wherein a source of the first transistor is connected to a power supply, a gate of the first transistor is connected to a drain of the first transistor, and the drain of the first transistor is connected to a drain of the second transistor; a gate of the second transistor is connected to a first input terminal, and a source of the second transistor is connected to a drain of the third transistor; and a source of the third transistor is grounded, and the drain of the third transistor is connected to a gate of the third transistor; the second branch includes a fourth transistor, a fifth transistor and a sixth transistor; wherein a source of the fourth transistor is connected to the power supply, a gate of the fourth transistor is connected to a drain of the fourth transistor, and the drain of the fourth transistor is connected to a drain of the fifth transistor; a gate of the fifth transistor is connected to a second input terminal, and a source of the fifth transistor is connected to a drain of the sixth transistor; and a source of the sixth transistor is grounded, and the drain of the sixth transistor is connected to a gate of the sixth transistor; and the third branch includes a seventh transistor and an eighth transistor; wherein a source of the seventh transistor is connected to the power supply, a gate of the seventh transistor is connected to the drain of the first transistor, a drain of the seventh transistor is connected to an output terminal of the voltage comparator and a drain of the eighth transistor, and the seventh transistor and the first transistor form a current mirror; and a gate of the eighth transistor is connected to the drain of the sixth transistor, the drain of the eighth transistor is connected to the output terminal of the voltage comparator, a source of the eighth transistor is grounded, and the eighth transistor and the sixth transistor form a current mirror.

DETAILED DESCRIPTION

To make the objectives, technical solutions and advantages of the embodiments of the present disclosure clearer, the technical solutions according to the embodiments of the present disclosure are clearly and thoroughly described with reference to the accompanying drawings of the embodiments of the present disclosure. The described embodiments are merely exemplary ones, but are not all the embodiments of the present disclosure. Based on the embodiments of the present disclosure, all other embodiments derived by persons of ordinary skill in the art without any creative efforts shall fall within the protection scope of the present disclosure.

Embodiment 1

Figure 1:
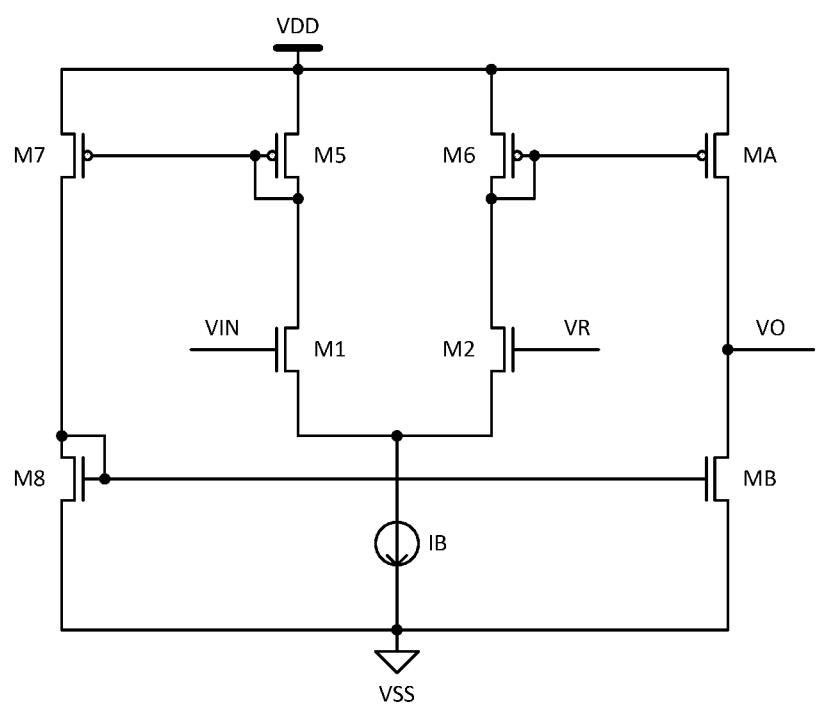
FIG. 1 is a circuit diagram of a voltage comparator in the related art.
Figure 2:
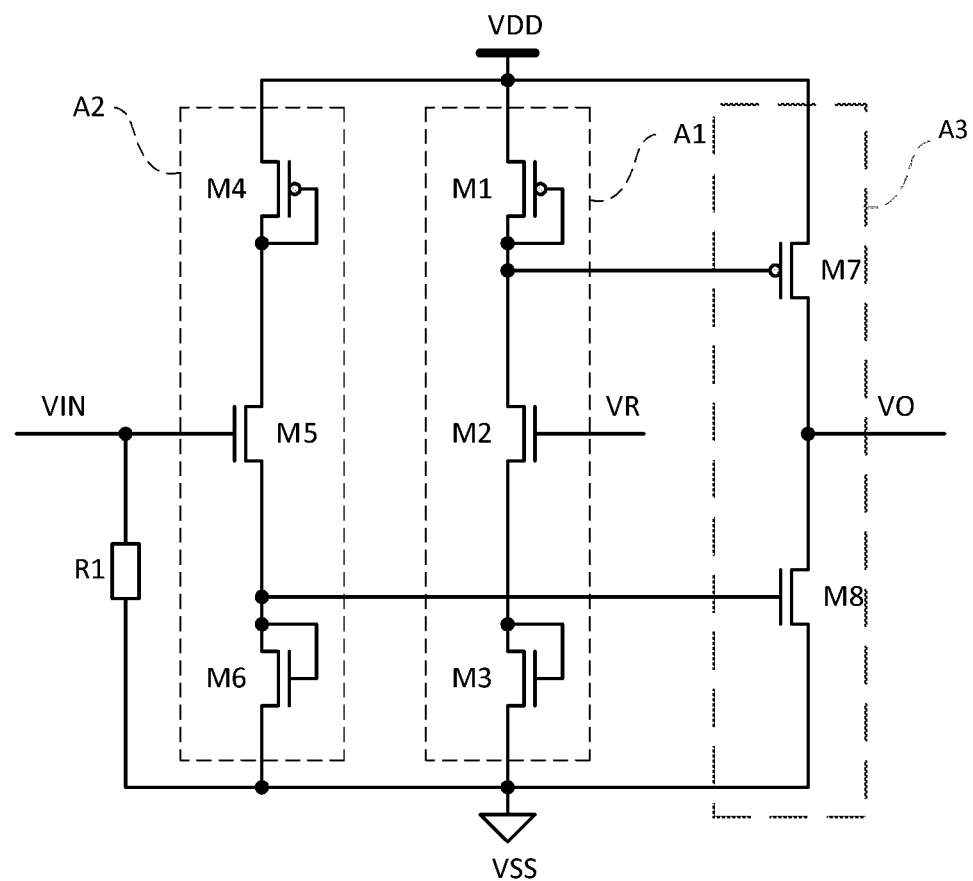
FIG. 2 is a circuit diagram of a voltage comparator according to a first embodiment of the present disclosure.

As illustrated in FIG. 2, the present disclosure provides a voltage comparator, including a first branch A1, a second branch A2 and a third branch A3. The first branch A1 includes a first transistor M1, a second transistor M2 and a third transistor M3. A source of the first transistor M1 is connected to a power supply VDD, a gate of the first transistor M1 is connected to a drain of the first transistor M1, and the drain of the first transistor M1 is connected to a drain of the second transistor M2. A gate of the second transistor M2 is connected to a first input terminal VR, and a source of the second transistor M2 is connected to a drain of the third transistor M3. A source of the third transistor M3 is connected to a ground VSS, and the drain of the third transistor M3 is connected to a gate of the third transistor M3. The first branch A1 has self-biasing capability, and requires no external bias signal to control the current thereof. The current of the first branch A1 is positively proportional to a voltage of VR because a higher voltage of VR indicates a smaller conduction resistance of the second transistor M2 and a greater current of the first branch A1.

The second branch A2 includes a fourth transistor M4, a fifth transistor M5 and a sixth transistor M6. A source of the fourth transistor M4 is connected to the power supply VDD, a gate of the fourth transistor M4 is connected to a drain of the fourth transistor M4, and the drain of the fourth transistor M4 is connected to a drain of the fifth transistor M5. A gate of the fifth transistor M5 is connected to a second input terminal VIN, and a source of the fifth transistor M5 is connected to a drain of the sixth transistor M6. A source of the sixth transistor M6 is connected to the ground VSS, and the drain of the sixth transistor M6 is connected to a gate of the sixth transistor M6. Likewise, the second branch A2 also has self-biasing capability, and a current thereof is positively proportional to voltage of VIN.

The third branch A3 includes a seventh transistor M7 and an eighth transistor M8. A source of the seventh transistor M7 is connected to the power supply VDD, a gate of the seventh transistor M7 is connected to a node between the first transistor M1 and the second transistor M2 (i.e., connected to the drain of the first transistor M1), a drain of the seventh transistor M7 is connected to an output terminal VO of the voltage comparator and a drain of the eighth transistor M8; the seventh transistor M7 and the first transistor M1 form a current mirror. A gate of the eighth transistor M8 is connected to a node between the fifth transistor M5 and the sixth transistor M6 (i.e., connected to the drain of the sixth transistor M6), the drain of the eighth transistor M8 is connected to the output terminal VO of the voltage comparator, a source of the eighth transistor M8 is connected to the ground VSS; the eighth transistor M8 and the sixth transistor M6 form a current mirror.

In the following descriptions, VR, VIN, VO may also refer to a voltage of the first input terminal VR, a voltage of the second input terminal VIN and a voltage of the output terminal VO respectively. In this embodiment, when VIN<VR, the current mirrored by M7 is greater than the current mirrored by M8, and the output VO is a high level; and when VIN>VR, the current mirrored by M7 is less than the current mirrored by M8, and the output VO is a low level.

Further, the voltage comparator further includes a first resistor R1, one terminal of the first resistor R1 is connected to the second input terminal VIN, and the other terminal of the first resistor is connected to the ground VSS. The first resistor R1 is configured to pull VIN down to 0 V when the second input terminal VIN is floated. Preferably, in this embodiment, the first transistor M1, the fourth transistor M4 and the seventh transistor M7 are PMOS transistors; and the second transistor M2, the third transistor M3, the fifth transistor M5, the sixth transistor M6 and the eighth transistor M8 are NMOS transistors.

Assuming that VR is a reference voltage and VIN is a tested voltage, when VDD=2.5 V, the power consumption of the first branch A1 may be desired to be less than 80 nA by designing the voltage value of VR and size designs of M2, M4 and M6.

If the voltage of VIN is 0, the first transistor M1 is cut off, and the current of the second branch A2 is 0. If VIN is floated, the first resistor R1 pulls VIN down to 0 V, and the current of the second branch A2 is still 0. When VIN>0, the first resistor R1 consumes current from VIN, and when VIN enabled MI to be conducted, the current consumed by the second branch A2 is positively proportional to VIN.

When VIN=0 V or VIN is floated, the current of the second branch A2 is 0. Therefore, the current mirrored by M8 from M3 is also 0. If VR in this case is a reference voltage and VDD=2.5 V, the power consumption of the first branch A1 is less than 80 nA. As such, although M7 mirrors the current of M6, the current of M7 definitely flows through M8, and in this case the current of M8 is 0. Therefore, the current of M7 is restricted to 0. Therefore, the voltage comparator according to this embodiment may have a lowest static power consumption of less than 0.2 µW.

In this embodiment, the voltage comparator having the extremely low static power consumption is applied in power voltage detection of a portable electronic device, VR is connected to a battery power supply, and VIN is connected to an external power supply. As such, when the external power supply is not connected, only the first branch A1 of the voltage comparator consumes the current, and the power consumption may be less than 0.2 µW. When an external power supply is connected, the added power consumption includes the current of the second branch A2, the current of the first resistor R1, and the current on M7 and M8. However, in this case due to the presence of the external power supply, the added power consumption does not consume power of the battery. In this embodiment, when the circuit is in the working state, there are four power-consuming branches (branches A1, A2 and A3 and the branch where the first resistor is located), the current flowing through the entire circuit is 320 nA, and the average current flowing through the branch A1 is 80 nA. When the circuit is in the static state, only the first branch A1 is conducted. Since the first branch A1 employs the self-biasing design, the current of the first branch A1 is still 80 nA, the currents of the other branches are 0, and the static power consumption of the entire circuit is 80 nA*VDD. Under the same VDD, the static power consumption of the circuit according to this embodiment is relatively low. Meanwhile, fewer power-consuming branches exist in the circuit, and the reliability under low power consumption is high.

Embodiment 2

Figure 3:
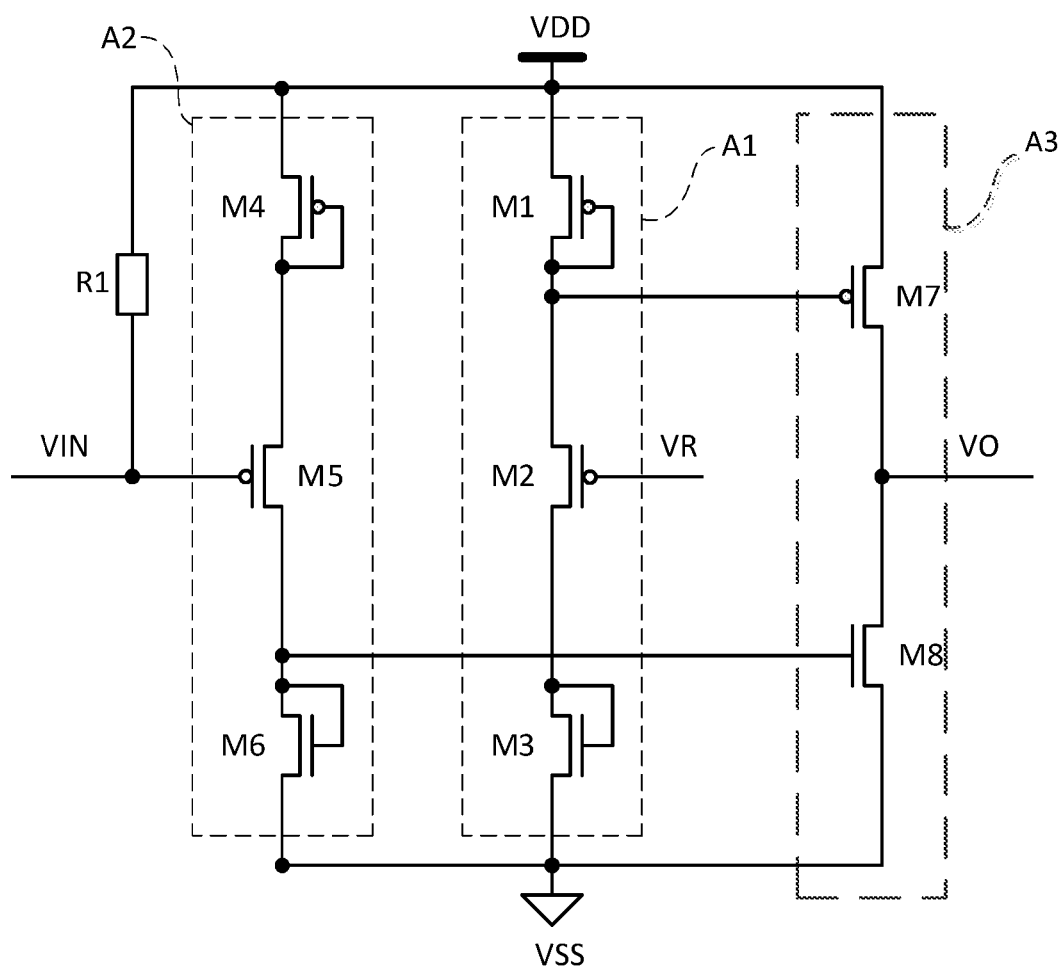
FIG. 3 is a circuit diagram of a voltage comparator according to a second embodiment of the present disclosure.

As illustrated in FIG. 3, the voltage comparator according to this embodiment is different from that in Embodiment 1 in that one end of the first resistor R1 is connected to a second input terminal VIN, and the other end of the first resistor R1 is connected to a power supply VDD. In this embodiment, the first transistor M1, the second transistor M2, the fourth transistor M4, the fifth transistor M5 and the seventh transistor M7 are PMOS transistors; and the third transistor M3, the sixth transistor M6 and the eighth transistor M8 are NMOS transistors.

Embodiment 3

Figure 4:
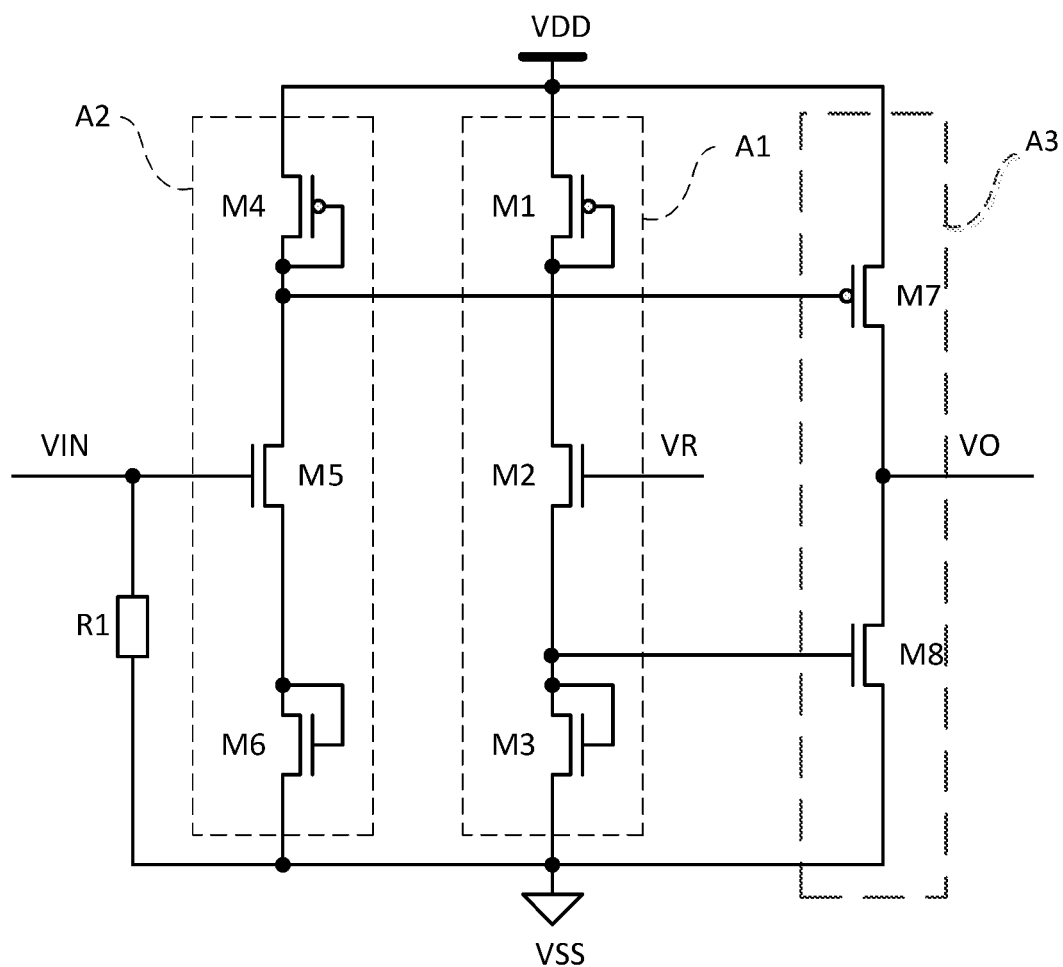
FIG. 4 is a circuit diagram of a voltage comparator according to a third embodiment of the present disclosure.

As illustrated in FIG. 4, the present disclosure provides a voltage comparator, including a first branch A1, a second branch A2 and a third branch A3. The first branch A1 includes a first transistor M1, a second transistor M2 and a third transistor M3. A source of the first transistor M1 is connected to a power supply VDD, a gate of the first transistor M1 is connected to a drain of the first transistor M1, and the drain of the first transistor M1 is connected to a drain of the second transistor M2. A gate of the second transistor M2 is connected to a first input terminal VR, and a source of the second transistor M2 is connected to a drain of the third transistor M3. A source of the third transistor M3 is connected to a ground VSS, and the drain of the third transistor M3 is connected to a gate of the third transistor M3.

The second branch A2 includes a fourth transistor M4, a fifth transistor M5 and a sixth transistor M6. A source of the fourth transistor M4 is connected to the power supply VDD, a gate of the fourth transistor M4 is connected to a drain of the fourth transistor M4, and the drain of the fourth transistor M4 is connected to a drain of the fifth transistor M5. A gate of the fifth transistor M5 is connected to a second input terminal VIN, and a source of the fifth transistor M5 is connected to a drain of the sixth transistor M6. A source of the sixth transistor M6 is connected to the ground VSS, and the drain of the sixth transistor M6 is connected to a gate of the sixth transistor M6.

The third branch A3 includes a seventh transistor M7 and an eighth transistor M8. A source of the seventh transistor M7 is connected to the power supply VDD, a gate of the seventh transistor M7 is connected to a node between the fourth transistor M4 and the fifth transistor M5 (i.e., connected to the drain of the fourth transistor M4), a drain of the seventh transistor M7 is connected to an output terminal VO of the voltage comparator and a drain of the eighth transistor M8; the seventh transistor M7 and the fourth transistor M4 form a current mirror. A gate of the eighth transistor M8 is connected to a node between the second transistor M2 and the third transistor M3 (i.e., connected to the drain of the third transistor M3), the drain of the eighth transistor M8 is connected to the output terminal VO of the voltage comparator, a source of the eighth transistor M8 is grounded; the eighth transistor M8 and the third transistor M3 form a current mirror.

Moreover, the voltage comparator further includes a first resistor R1, one end of the first resistor R1 is connected to the second input terminal VIN, and the other end of the first resistor is connected to the ground VSS.

In this embodiment, the first transistor M1, the fourth transistor M4 and the seventh transistor M7 are PMOS transistors; and the second transistor M2, the third transistor M3, the fifth transistor M5, the sixth transistor M6 and the eighth transistor M8 are NMOS transistors.

Embodiment 4

Figure 5:
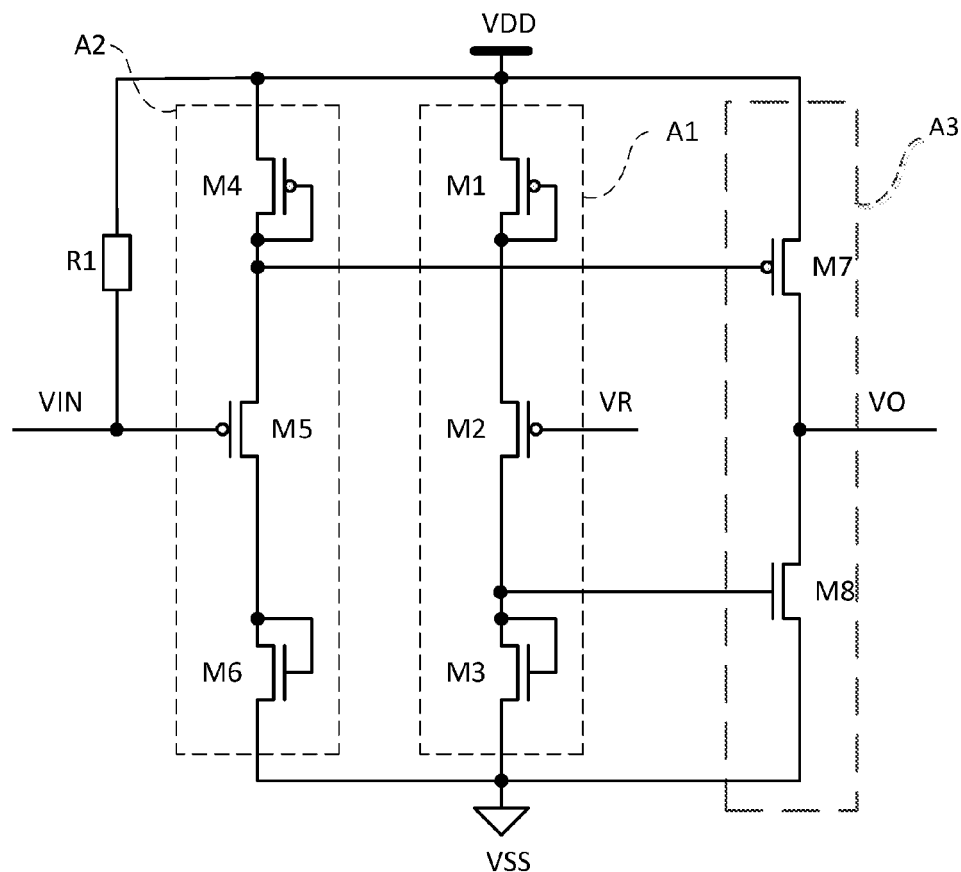
FIG. 5 is a circuit diagram of a voltage comparator according to a fourth embodiment of the present disclosure.

As illustrated in FIG. 5, the voltage comparator according to this embodiment is different from that in Embodiment 3 in that one end of the first resistor R1 is connected to a second input terminal VIN, and the other end of the first resistor R1 is connected to a power supply VDD. In this embodiment, the first transistor M1, the second transistor M2, the fourth transistor M4, the fifth transistor M5 and the seventh transistor M7 are PMOS transistors; and the third transistor M3, the sixth transistor M6 and the eighth transistor M8 are NMOS transistors.

Embodiment 5

Figure 6:
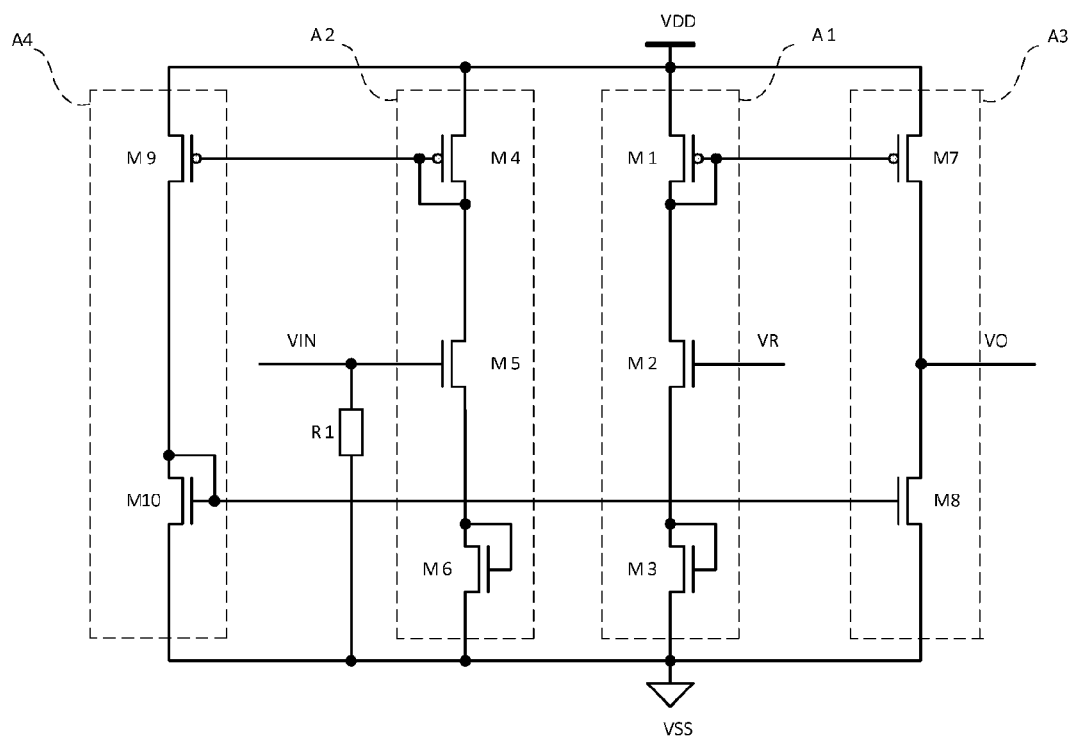
FIG. 6 is a circuit diagram of a voltage comparator according to a fifth embodiment of the present disclosure.

As illustrated in FIG. 6, the present disclosure provides a voltage comparator, including a first branch A1, a second branch A2, a third branch A3 and a fourth branch A4. The first branch A1 includes a first transistor M1, a second transistor M2 and a third transistor M3. A source of the first transistor M1 is connected to a power supply VDD, a gate of the first transistor M1 is connected to a drain of the first transistor M1, and the drain of the first transistor M1 is connected to a drain of the second transistor M2. A gate of the second transistor M2 is connected to a first input terminal VR, and a source of the second transistor M2 is connected to a drain of the third transistor M3. A source of the third transistor M3 is connected to a ground VSS, and the drain of the third transistor M3 is connected to a gate of the third transistor M3.

The second branch A2 includes a fourth transistor M4, a fifth transistor M5 and a sixth transistor M6. A source of the fourth transistor M4 is connected to the power supply VDD, a gate of the fourth transistor M4 is connected to a drain of the fourth transistor M4, and the drain of the fourth transistor M4 is connected to a drain of the fifth transistor M5. A gate of the fifth transistor M5 is connected to a second input terminal VIN, and a source of the fifth transistor M5 is connected to a drain of the sixth transistor M6. A source of the sixth transistor M6 is grounded, and the drain of the sixth transistor M6 is connected to a gate of the sixth transistor M6.

The third branch A3 includes a seventh transistor M7 and an eighth transistor M8. A source of the seventh transistor M7 is connected to the power supply VDD, a gate of the seventh transistor M7 is connected to a node between the first transistor M1 and the second transistor M2 (i.e., connected to the gate or the drain of the first transistor M1), a drain of the seventh transistor M7 is connected to an output terminal VO of the voltage comparator and a drain of the eighth transistor M8; the seventh transistor M7 and the first transistor M1 form a current mirror. The drain of the eighth transistor M8 is connected to the output terminal VO of the voltage comparator, a source of the eighth transistor M8 is grounded, and a node between the drains of the seventh transistor M7 and the eighth transistor M8 (i.e., the drain of the eight transistor M8) are configured as the output terminal VO.

The fourth branch A4 includes a ninth transistor M9 and a tenth transistor M10. A source of the ninth transistor M9 is connected to the power supply VDD, a gate of the ninth transistor M9 is connected to the gate of the fourth transistor M4, and a drain of the ninth transistor M9 is connected to a drain of the tenth transistor M10. A gate of the tenth transistor M10 is connected to a gate of the eighth transistor M8, the drain of the tenth transistor M10 is connected to the gate of the tenth transistor M10, and a source of the tenth transistor M10 is grounded VSS.

Moreover, the voltage comparator further includes a first resistor R1, one terminal of the first resistor R1 is connected to the second input terminal VIN, and the other terminal of the first resistor is connected to the ground VSS. In this embodiment, the first transistor M1, the fourth transistor M4, the seventh transistor M7 and the ninth transistor M9 are PMOS transistors; and the second transistor M2, the third transistor M3, the fifth transistor M5, the sixth transistor M6, the eighth transistor M8 and the tenth transistor M10 are NMOS transistors.

Embodiment 6

Figure 7:
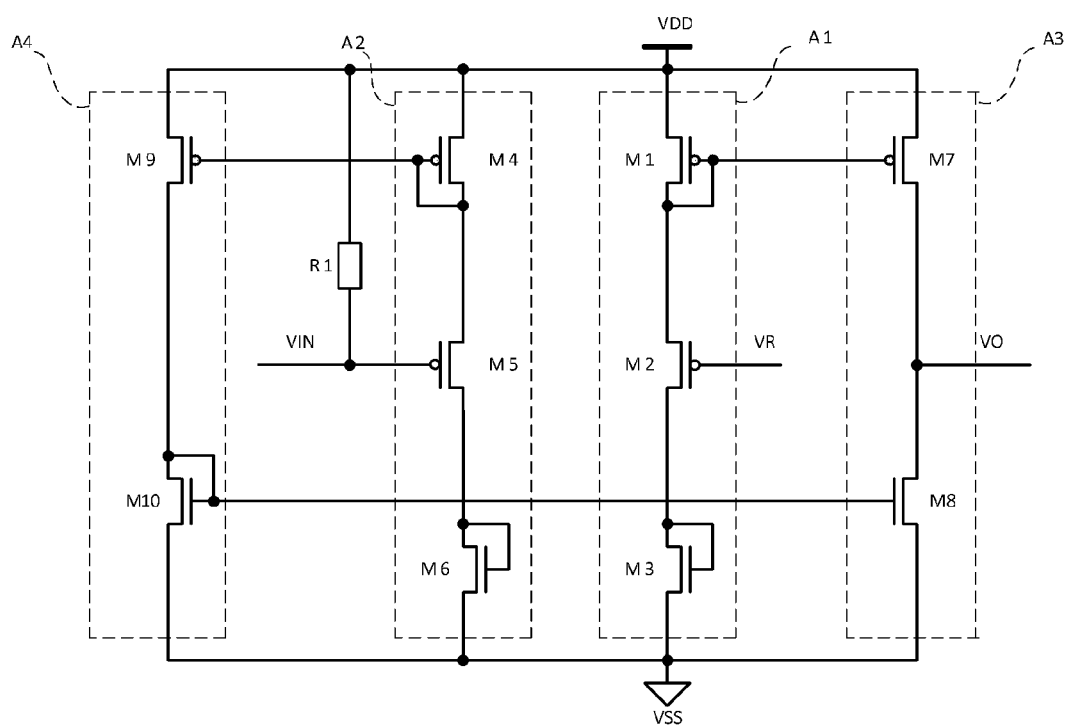
FIG. 7 is a circuit diagram of a voltage comparator according to a sixth embodiment of the present disclosure.

As illustrated in FIG. 7, the voltage comparator according to this embodiment is different from that in Embodiment 5 in that one end of the first resistor R1 is connected to a second input terminal VIN, and the other end of the first resistor R1 is connected to a power supply VDD. In this embodiment, the first transistor M1, the second transistor M2, the fourth transistor M4, the fifth transistor M5, the seventh transistor M7 and the ninth transistor M9 are PMOS transistors; and the third transistor M3, the sixth transistor M6, the eighth transistor M8 and the tenth transistor M10 are NMOS transistors.

Described above are merely preferred embodiments of the present disclosure, but are not intended to limit the present disclosure. Any modification, equivalent replacement, or improvement made without departing from the spirit and principle of the present disclosure should fall within the protection scope of the present disclosure.

INDUSTRIAL APPLICABILITY

As compared with the related art, the voltage comparator according to the embodiments of the present disclosure has the following beneficial effects: firstly, the circuit has self-biasing capabilities, and thus requires no dedicated bias circuit; secondly, under the same power voltage, the static power consumption of the voltage comparator is relatively low; thirdly, fewer power consuming branches exist in the circuit, and the reliability is high under low power consumption.

What is claimed is:

1. A voltage comparator, comprising a first branch, a second branch and a third branch; wherein:
   the first branch comprises a first transistor, a second transistor and a third transistor; wherein
   a source of the first transistor is connected to a power supply, a gate of the first transistor is connected to a drain of the first transistor, and the drain of the first transistor is connected to a drain of the second transistor;
   a gate of the second transistor is connected to a first input terminal, and a source of the second transistor is connected to a drain of the third transistor;
   a source of the third transistor is grounded, and the drain of the third transistor is connected to a gate of the third transistor;
   the second branch comprises a fourth transistor, a fifth transistor and a sixth transistor; wherein
   a source of the fourth transistor is connected to the power supply, a gate of the fourth transistor is connected to a drain of the fourth transistor, and the drain of the fourth transistor is connected to a drain of the fifth transistor;
   a gate of the fifth transistor is connected to a second input terminal, and a source of the fifth transistor is connected to a drain of the sixth transistor;
   a source of the sixth transistor is grounded, and the drain of the sixth transistor is connected to a gate of the sixth transistor; and the third branch comprises a seventh transistor and an eighth transistor; wherein
   a source of the seventh transistor is connected to the power supply, a gate of the seventh transistor is connected to the drain of the first transistor, a drain of the seventh transistor is connected to an output terminal of the voltage comparator and a drain of the eighth transistor; the seventh transistor and the first transistor form a current mirror; and
   a gate of the eighth transistor is connected to the drain of the sixth transistor, the drain of the eighth transistor is connected to the output terminal of the voltage comparator, a source of the eighth transistor is grounded; the eighth transistor and the sixth transistor form a current mirror.

2. The voltage comparator according to claim 1, further comprising a first resistor, wherein one terminal of the first resistor is connected to the second input terminal, and the other terminal of the first resistor is grounded.

3. The voltage comparator according to claim 2, wherein the first transistor, the fourth transistor and the seventh transistor are PMOS transistors; and the second transistor, the third transistor, the fifth transistor, the sixth transistor and the eighth transistor are NMOS transistors.

4. The voltage comparator according to claim 1, further comprising a first resistor, wherein one terminal of the first resistor is connected to the second input terminal, and the other terminal of the first resistor is connected to the power supply.

5. The voltage comparator according to claim 4, wherein the first transistor, the second transistor, the fourth transistor, the fifth transistor and the seventh transistor are PMOS transistors; and the third transistor, the sixth transistor and the eighth transistor are NMOS transistors.

6. A voltage comparator, comprising a first branch, a second branch and a third branch; wherein:
   the first branch comprises a first transistor, a second transistor and a third transistor; wherein
   a source of the first transistor is connected to a power supply, a gate of the first transistor is connected to a drain of the first transistor, and the drain of the first transistor is connected to a drain of the second transistor;
   a gate of the second transistor is connected to a first input terminal, and a source of the second transistor is connected to a drain of the third transistor;
   a source of the third transistor is grounded, and the drain of the third transistor is connected to a gate of the third transistor;
   the second branch comprises a fourth transistor, a fifth transistor and a sixth transistor; wherein
   a source of the fourth transistor is connected to a power supply, a gate of the fourth transistor is connected to a drain of the fourth transistor, and the drain of the fourth transistor is connected to a drain of the fifth transistor;
   a gate of the fifth transistor is connected to a second input terminal, and a source of the fifth transistor is connected to a drain of the sixth transistor;
   a source of the sixth transistor is grounded, and the drain of the sixth transistor is connected to a gate of the sixth transistor; and
   the third branch comprises a seventh transistor and an eighth transistor; wherein
   a source of the seventh transistor is connected to the power supply, a gate of the seventh transistor is connected to the drain of the fourth transistor, a drain of the seventh transistor is connected to an output terminal of the voltage comparator and a drain of the eighth transistor; the seventh transistor and the fourth transistor form a current mirror; and a gate of the eighth transistor is connected to the drain of the third transistor, the drain of the eighth transistor is connected to the output terminal of the voltage comparator, a source of the eighth transistor is grounded; the eighth transistor and the third transistor form a current mirror.

7. The voltage comparator according to claim 6, further comprising a first resistor, wherein one terminal of the first resistor is connected to the second input terminal, and the other terminal of the first resistor is grounded.

8. The voltage comparator according to claim 7, wherein the first transistor, the fourth transistor and the seventh transistor are PMOS transistors; and the second transistor, the third transistor, the fifth transistor, the sixth transistor and the eighth transistor are NMOS transistors.

9. The voltage comparator according to claim 6, further comprising a first resistor, wherein one terminal of the first resistor is connected to the second input terminal, and the other terminal of the first resistor is connected to the power supply.

10. The voltage comparator according to claim 9, wherein the first transistor, the fourth transistor and the seventh transistor are PMOS transistors; and the second transistor, the third transistor, the fifth transistor, the sixth transistor and the eighth transistor are NMOS transistors.

11. A voltage comparator, comprising a first branch, a second branch and a third branch and a fourth branch, wherein:

the first branch comprises a first transistor, a second transistor and a third transistor; wherein a first connection node of the first transistor is connected to a power supply, a control node of the first transistor is connected to a second connection node of the first transistor, and the second connection node of the first transistor is connected to a first connection node of the second transistor;

a control node of the second transistor is connected to a first input terminal, and a second connection node of the second transistor is connected to a first connection node of the third transistor;

a second connection node of the third transistor is grounded, and the first connection node of the third transistor is connected to a control node of the third transistor;

the second branch comprises a fourth transistor, a fifth transistor and a sixth transistor; wherein a first connection node of the fourth transistor is connected to the power supply, a control node of the fourth transistor is connected to a second connection node of the fourth transistor, and the second connection node of the fourth transistor is connected to a first connection node of the fifth transistor;

a control node of the fifth transistor is connected to a second input terminal, and a second connection node of the fifth transistor is connected to a first connection node of the sixth transistor;

a second connection node of the sixth transistor is grounded, and the first connection node of the sixth transistor is connected to a control node of the sixth transistor;

the third branch comprises a seventh transistor and an eighth transistor; wherein a first connection node of the seventh transistor is connected to the power supply, a second connection node of the seventh transistor is connected to an output terminal of the voltage comparator; and a first connection node of the eighth transistor is connected to the output terminal of the voltage comparator, a second connection node of the eighth transistor is grounded, wherein a control node of the seventh transistor is connected to the second connection node of the first transistor and a control node of the eighth transistor is connected to the first connection node of the sixth transistor; or the control node of the seventh transistor is connected to the second connection node of the fourth transistor and the control node of the eighth transistor is connected to the first connection node of the third transistor.

12. The voltage comparator according to claim 11, further comprising a resistor, wherein one terminal of the resistor is connected to the second input terminal, and the other terminal of the resistor is grounded.

13. The voltage comparator according to claim 12, wherein the first transistor, the fourth transistor and the seventh transistor are PMOS transistors; the second transistor, the third transistor, the fifth transistor, the sixth transistor and the eighth transistor are NMOS transistors.

14. The voltage comparator according to claim 11, further comprising a resistor, wherein one terminal of the resistor is connected to the second input terminal, and the other terminal of the resistor is connected to the power supply.

15. The voltage comparator according to claim 14, wherein the first transistor, the second transistor, the fourth transistor, the fifth transistor and the seventh transistor are PMOS transistors; the third transistor, the sixth transistor and the eighth transistor are NMOS transistors.

* * * * *